United States Patent [19]

Tserng

[11] Patent Number: 5,324,682
[45] Date of Patent: Jun. 28, 1994

[54] METHOD OF MAKING AN INTEGRATED CIRCUIT CAPABLE OF LOW-NOISE AND HIGH-POWER MICROWAVE OPERATION

[75] Inventor: Hua Q. Tserng, Dallas, Tex.

[73] Assignee: Texas Instruments Incorporated, Dallas, Tex.

[21] Appl. No.: 55,074

[22] Filed: Apr. 29, 1993

[51] Int. Cl.⁵ .............................................. H01L 21/72
[52] U.S. Cl. ...................................... 437/56; 437/133; 437/184; 437/912
[58] Field of Search ................... 437/54, 56, 126, 133, 437/184, 912, 969, 976; 148/DIG. 65, DIG. 72, DIG. 97, DIG. 126

[56] References Cited

U.S. PATENT DOCUMENTS

| | | | |
|---|---|---|---|
| 4,746,627 | 5/1988 | Zuleeg | 437/133 |
| 5,077,231 | 12/1991 | Plumton et al. | 437/56 |
| 5,100,831 | 3/1992 | Kuwata | 437/133 |
| 5,151,758 | 9/1992 | Smith | 437/126 |
| 5,166,083 | 11/1992 | Bayraktaroglu | 148/DIG. 72 |
| 5,234,848 | 8/1993 | Seabaugh | 437/133 |
| 5,254,492 | 10/1993 | Tserng | 437/56 |

OTHER PUBLICATIONS

Saunier et al., U.S. appl. #07/648,091 "GaAs FET with resistive AlGaAs", filed Jan. 31, 1991, abandoned Mar. 21, 1992.

Primary Examiner—Brian E. Hearn
Assistant Examiner—Chandra Chaudhari
Attorney, Agent, or Firm—Michael K. Skrehot; James C. Kesterson; Richard L. Donaldson

[57] ABSTRACT

In one form of the invention, an integrated circuit for providing low-noise and high-power microwave operation is disclosed comprising: a) a material structure formed during a single epitaxial growth cycle, said structure comprising: i) a substrate 10; ii) a donor layer 16 above the substrate; iii) a first wide bandgap buffer layer 18 above the donor layer; iv) an undoped first channel layer 19 above the first wide bandgap layer; v) a second channel layer 24 above the first channel layer; and vi) a second wide bandgap layer 26 above the second channel layer; b) a first device 80 fabricated of the material structure comprising: i) a first source contact 50 to said first channel layer; ii) a first drain contact 54 to said first channel layer; and iii) a first gate contact 38 above the first channel layer; and c) a second device 82 fabricated of the material structure comprising: i) a second source contact 52 to said second channel layer; ii) a second drain contact 56 to said second channel layer; and iii) a second gate 46 contacting the second wide band-gap layer.

9 Claims, 3 Drawing Sheets

METHOD OF MAKING AN INTEGRATED CIRCUIT CAPABLE OF LOW-NOISE AND HIGH-POWER MICROWAVE OPERATION

FIELD OF THE INVENTION

This invention generally relates to integrated circuits capable of low-noise and high-power microwave operation.

BACKGROUND OF THE INVENTION

Field Effect Transistors (FETs) are well known to be ideal for use in applications requiring amplification or switching at radio or microwave frequencies. FETs fabricated primarily of GaAs are particularly suited for high frequency uses because of the high electron mobility characteristic of this compound semiconductor. In the past, FETs have utilized a Schottky barrier gate structure (hence the common name Metal-semiconductor Field Effect Transistor, or MESFET) and have been fabricated on semi-insulating GaAs substrates with all dopants being ion implanted.

Recently, the performance demands of modern radar and telecommunications equipment have outstripped the capabilities of traditional MESFET technology. Consequently, FETs have evolved into largely epitaxial structures where semiconductor layers are precisely grown and doped in situ in the growth process. One new type of FET is the High Electron Mobility Transistor (HEMT). A prime difference between the HEMT and FET is in where the source-drain current flows. In the FET, the electrons flow in a doped channel layer, through the donor ions, and therefore undergo considerable scattering. In the HEMT, however, a potential well is created at a heterojunction interface (typically between GaAs and AlGaAs) due to the different conduction band energies for the two materials. The electrons come from the doped material having the larger energy bandgap (AlGaAs) and reside in the potential well, forming a two-dimensional electron gas. Since the electrons travel in the undoped smaller bandgap material (GaAs), and are physically separated from the donor ions, ionized impurity scattering is greatly reduced and the electrons move with higher mobility and velocity. This results in a device with superior microwave and radio frequency performance characteristics.

However, for frequencies above 60 GHz, conventional HEMTs have been shown to perform poorly because of low gain. The reason for this is thought to be that the electrons in the two-dimensional electron gas are difficult to confine at the short gate lengths required for this high-frequency operation. Consequently, a new type of HEMT has emerged that possesses improved carrier confinement. This device is known as a PHEMT, for Pseudomorphic High electron Mobility Transistor. The PHEMT differs from the conventional HEMT in that the channel layer is comprised of an even narrower bandgap material than in the HEMT. This channel is typically a thin (100-200 Angstroms) layer of InGaAs. The device is therefore based on the InGaAs/AlGaAs heterojunction, with electrons flowing in the undoped InGaAs. The benefits of using InGaAs as the channel include the enhanced electron transport in InGaAs as compared to GaAs, the large conduction band discontinuity which allows high 2DEG density and hence high current, and improved confinement of carriers due to the quantum well. PHEMTs have been shown be useful for frequencies as high as 100 GHz.

A further refinement of the PHEMT is the inverted PHEMT. The inverted PHEMT is characterized by having its channel layer vertically closer to the gate than the AlGaAs ion donor layer, which is in contrast to the conventional PHEMT. Inverted PHEMTs have exhibited very good low noise performance at low DC powers, a result thought to be attributable to the close gate and channel proximity and superior carrier confinement.

Another type of FET has evolved to permit operation with higher breakdown voltages and therefore at higher power than was possible with traditional MESFETs, and even HEMT devices. One method to achieve higher breakdown voltages in the past has been to incorporate an AlGaAs buffer layer atop a GaAs channel layer. The AlGaAs layer is undoped or lightly doped and separates the highly doped GaAs channel from the gate contact placed on top of the AlGaAs layer. This device is known generally as a MISFET (Metal Insulator Field Effect Transistor), or heterostructure FET (HFET), because of the "insulating" AlGaAs layer. Furthermore, HFETs have been shown to be very efficient devices for power applications. Power added efficiencies (PAEs) of over 75% have been reported with these devices.

Radar and telecommunications systems commonly require a low-noise device for receiver amplifiers, while also requiring high power and robust devices for power amplifiers used in transmitting applications. This has traditionally required a system designer to have integrated circuits for power amplifiers, integrated circuits for low-noise amplifiers, and even integrated circuits for the switching and phase shifting functions commonly used in these systems.

SUMMARY OF THE INVENTION

In the past, high frequency systems have been generally modular in nature, having separate integrated circuits for power, low-noise, switching and phase shifting functions. This approach was made necessary largely by the process and epitaxial material structure requirements of the devices used in the integrated circuits available to the system designer. The need to use separate integrated circuits for each system function drives up system cost and adversely impacts the reliability of the system because of the inter-chip connections and handling required.

As discussed hereinabove, PHEMTs and HFETs possess qualities that make them good candidates for use in integrated circuits, which in turn are used in radar and telecommunications systems. Inverted PHEMTs offer state-of-the-art noise performance, while HFETs similarly excel in power applications. However, though systems usually require both low-noise circuits and efficient high-power circuits, the state of the technology presently dictates that these systems use separate integrated circuits for each of the device types, i.e. PHEMT circuits are built on custom substrate and HFETs are built on a separate custom substrate.

There have been efforts in the past to integrate devices having different performance advantages, but these circuits required epitaxial regrowth, i.e. a multi-layer epitaxial structure was grown for a first type of device but then the epitaxial processing was stopped and other processing done (e.g. epitaxial material was then etched away in areas of the wafer in which a second device type was needed), and then epitaxial processing was resumed with a second epitaxial material structure being grown for the second device type. It is very difficult to obtain a good second epitaxial growth because of contaminants introduced into an epitaxial material growth chamber when it is opened. This process is also time-consuming and requires expert supervision. Consequently, a structure requiring only one epitaxial processing cycle and conventional processing would be desired to overcome these limitations. The present invention is intended to address these limitations.

In one form of the invention, an integrated circuit for providing low-noise and high-power microwave operation is disclosed comprising: a) a material structure formed during a single epitaxial growth cycle, said structure comprising: i) a substrate; ii) a donor layer above the substrate; iii) a first wide bandgap buffer layer above the donor layer; iv) an undoped first channel layer above the first wide bandgap layer; v) a second channel layer above the first channel layer; and vi) a second wide bandgap layer above the second channel layer; b) a first device fabricated of the material structure comprising: i) a first source contact to said first channel layer; ii) a first drain contact to said first channel layer; and iii) a first gate contact above the first channel layer; and c) a second device fabricated of the material structure comprising: i) a second source contact to said second channel layer; ii) a second drain contact to said second channel layer; and iii) a second gate contacting the second wide band-gap layer.

An advantage of the invention is that a single-chip solution to the needs of high-power and low-noise amplification and switching at state-of-the-art performance levels is made possible. In addition, the processing and material growth is simpler than in prior art solutions, because no regrowth of epitaxial material is required. All epitaxial material growth is done prior to processing.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
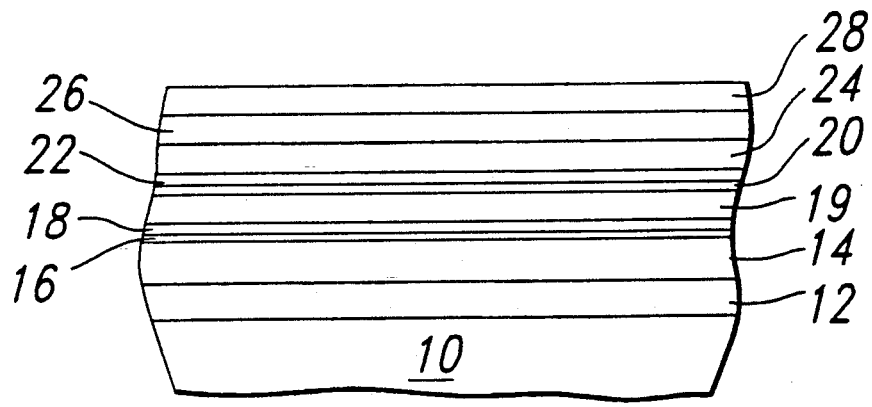
FIGS. 1–8 are cross-sectional views of a first preferred embodiment circuit integrating low-noise and power devices at various steps in a process sequence.

A first preferred embodiment of the invention is fabricated using the epitaxial material structure shown in FIG. 1. Table I lists the elements shown in FIG. 1 along with examples of preferred materials, doping concentrations and thicknesses. The material structure includes a semi-insulating GaAs substrate 10 with the following layers deposited on the substrate by Molecular Beam Epitaxy (MBE), Metal-Organic Chemical Vapor Deposition (MOCVD), or other such suitable method: a buffer layer, or in this embodiment, a superlattice buffer 12 of alternating thin AlAs and GaAs layers each about 20 Angstroms in thickness for a total thickness of approximately 0.1 μm; an approximately 300 Angstrom thick subdonor layer of preferably undoped or lightly doped AlGaAs 14; a very thin (e.g. 1 or 2 atomic layers) donor layer 16 of n-type dopant (preferably Si, or Sn, or other suitable dopant) to achieve a dopant atom concentration in the range of about $1 \times 10^{12}$ cm$^{-2}$ to $4 \times 10^{12}$ cm$^{-2}$, preferably $1 \times 10^{12}$ cm$^{-2}$; an approximately 50 Angstrom thick first wide bandgap buffer layer 18 of undoped AlGaAs; a first channel layer 19 of undoped InGaAs having a thickness in the range of approximately 100–150 Angstroms, but preferably 150 Angstroms; a spacer layer 20 of undoped GaAs having a thickness of approximately 200 Angstroms; an etch stop layer 22 of undoped InGaAs having a thickness of approximately 50 Angstroms; a second channel layer of GaAs (or alternatively of InGaAs for example) 24 having a thickness of approximately 700 Angstroms doped n-type in the range of approximately $3 \times 10^{17}$ cm$^{-3}$ to $5 \times 10^{17}$ cm$^{-3}$; but preferably about $3 \times 10^{17}$ cm$^{-3}$; a second wide bandgap layer of $Al_xGa_{1-x}As$ 26, where x is preferably 0.3, but may range from 0.2 to 0.33, having a thickness in the range of approximately 500 to 1000 Angstroms (preferably about 800 Angstroms), doped with Si, for example, to a concentration of approximately $1 \times 10^{17}$ cm$^{-3}$; and a GaAs cap layer 28, having a thickness in the range of approximately 500 to 1000 Angstroms (preferably about 1000 Angstroms), doped with Si, for example, to a concentration of approximately $5 \times 10^{18}$ cm$^{-3}$.

TABLE I

| Element | Name | Material | Doping Concentration | Thickness |
|---|---|---|---|---|
| 10 | Substrate | GaAs | Undoped | 625 um |
| 12 | Buffer | AlAs/GaAs | Undoped | 0.1 um |
| 14 | Subdonor | AlGaAs | Undoped | 300Å |
| 16 | Planar donor | Si | $1 \times 10^{12}$ cm$^{-2}$ | Atomic layer |
| 18 | First wide bandgap buffer | AlGaAs | Undoped | 50Å |
| 19 | First channel | InGaAs | Undoped | 150Å |
| 20 | Spacer | GaAs | Undoped | 200Å |
| 22 | Etch stop | InGaAs | Undoped | 50Å |
| 24 | Second channel | GaAs | $3 \times 10^{17}$ cm$^{-3}$ | 700Å |
| 26 | Second wide bandgap buffer | AlGaAs | $1 \times 10^{17}$ cm$^{-3}$ | 800Å |
| 28 | Cap | GaAs | $5 \times 10^{18}$ cm$^{-3}$ | 1000Å |

Figure 8:
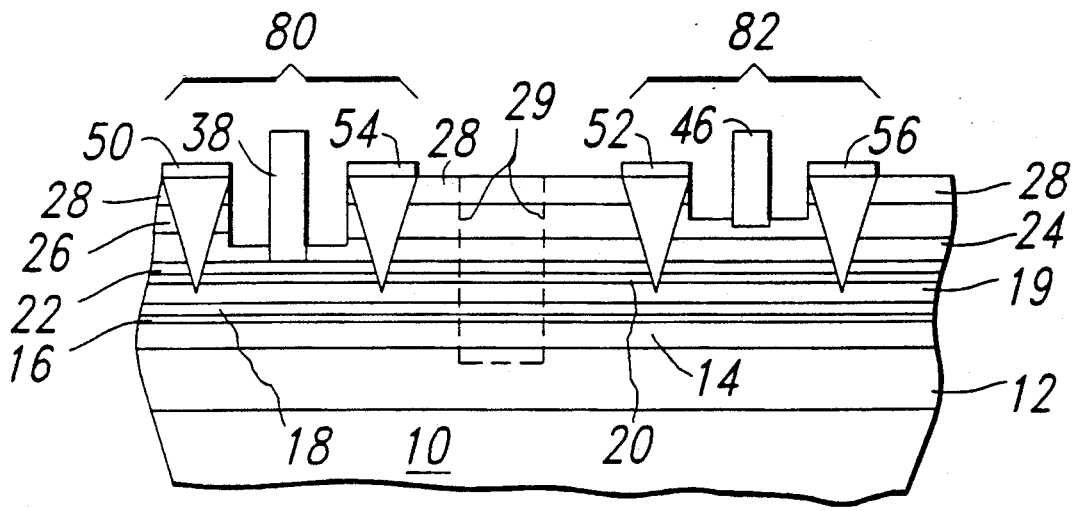

A brief description of the functions of the layers follows with reference to a completed structure, shown in FIG. 8. Layer 19 acts as the channel of the PHEMT 80. Electrons traverse the channel between the source and drain contacts of the PHEMT in a potential well created at the interface between the channel layer 19 and AlGaAs layer 18. The two-dimensional electron gas that forms in the well is populated with electrons from the highly doped planar layer 16. GaAs layer 24, the second or power channel layer, acts as the channel for the HFET device 82 and is separated from gate 46 by wide bandgap $Al_xGa_{1-x}As$ buffer layer 26. The use of a wide bandgap material, such as AlGaAs for layer 26 provides the Schottky gate 46 with a higher breakdown voltage capability than would be possible with a GaAs buffer layer. This is an important advantage for the power FET 82.

Figure 2:
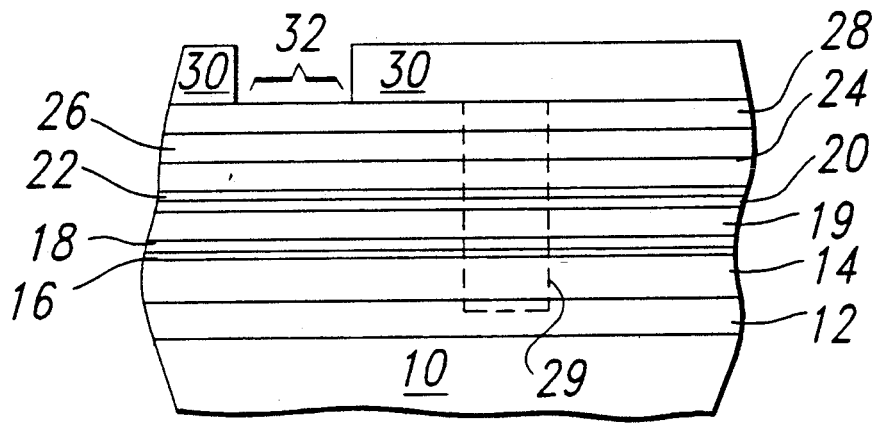
Figure 3:
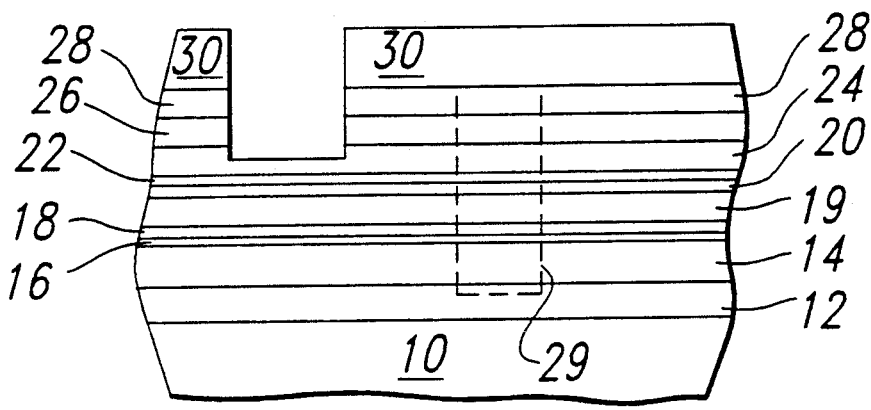
Figure 4:
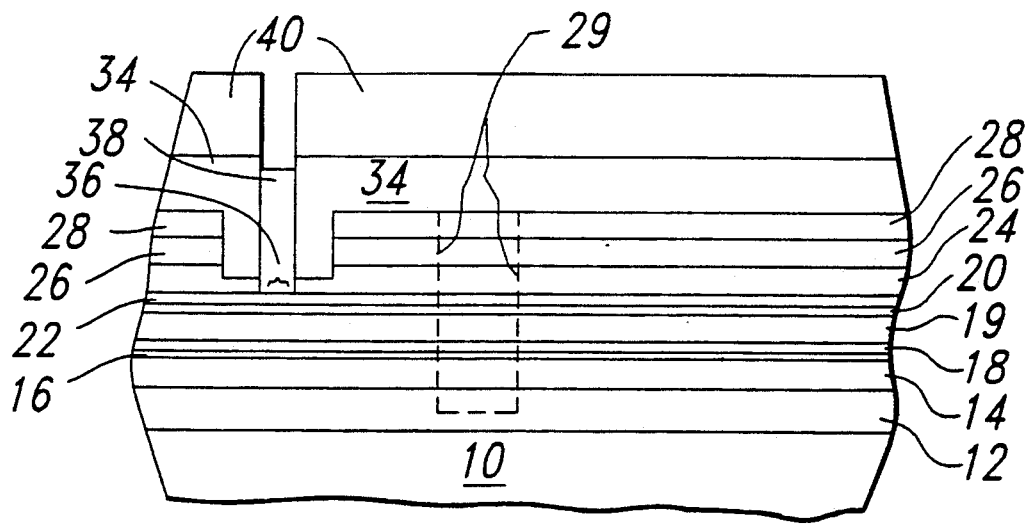
Figure 5:
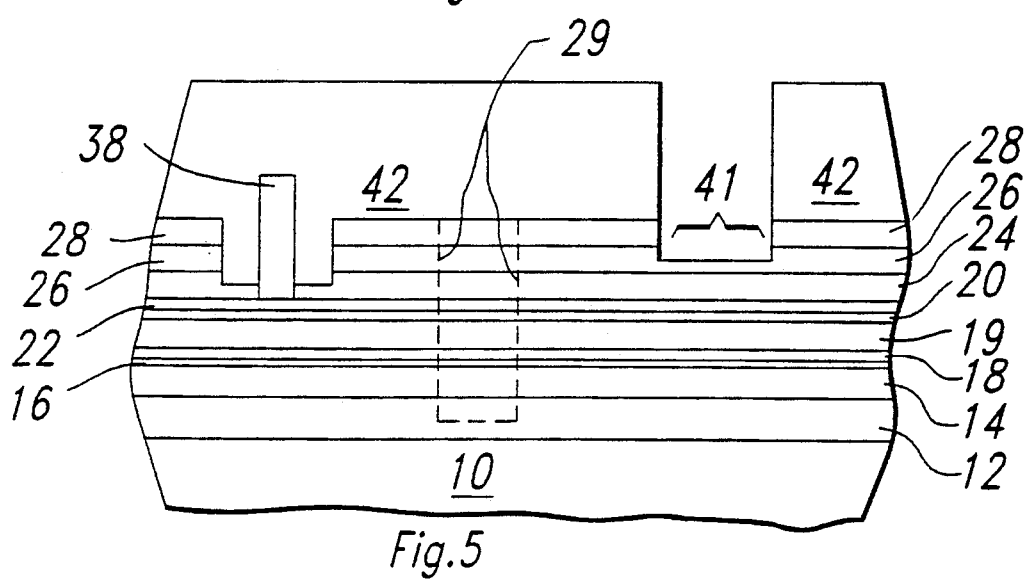
Figure 6:
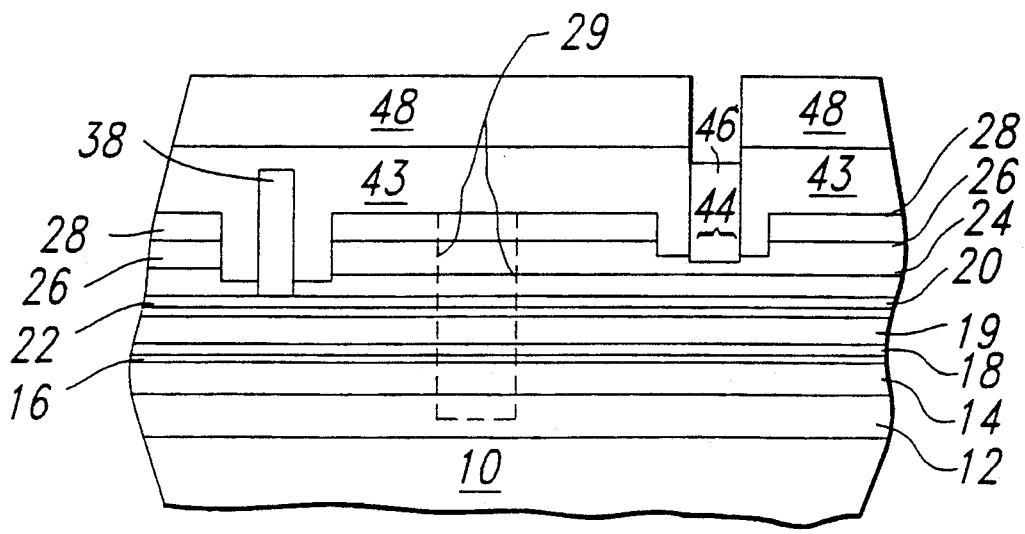
Figure 7:
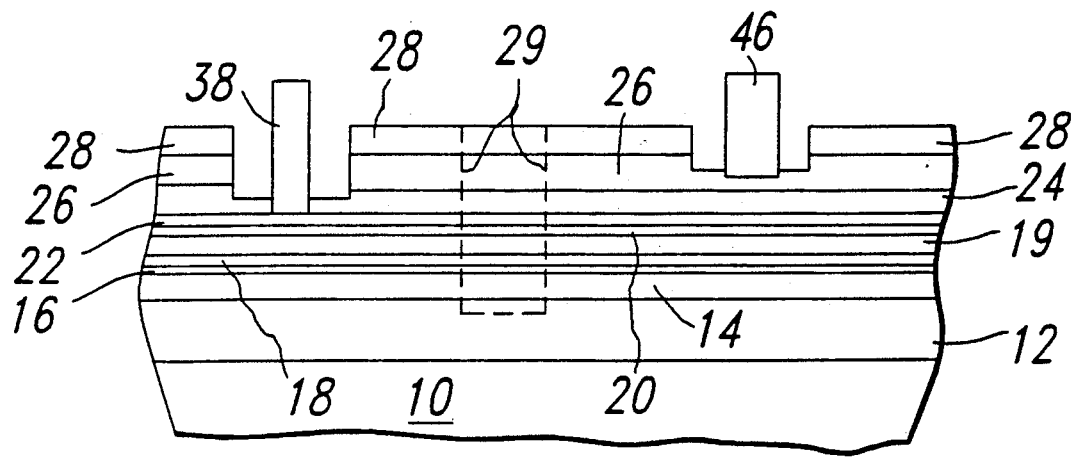

The process for defining PHEMT and HFET devices using the material structure described in FIG. 1 may begin with the step of isolating those parts of the substrate on which PHEMT circuitry occurs from those on which HFET circuitry occurs. This isolation is accomplished through the implantation of Oxygen ions, for example, to render layers 14, 16, 18, 19, 20, 22, 24, 26, and 28 semi-insulating in the region denoted with the dashed line 29 in FIG. 2. The embodiment described herein makes use of a recessed gate configuration known in the industry to enhance the performance of a high-frequency device by allowing the device designer control over breakdown and pinch-off voltages through locating the gate closer to the channel to be modulated. In this embodiment, a first recess for a PHEMT device is formed by depositing and patterning a photoresist layer 30 to define the location of the first recess 32 (approximately 3 μm in width) shown in FIG. 2. FIG. 3 shows the material structure after removal of layers 28, 26, and a portion of 24 by a method such as Reactive Ion Etching, for example, with BCl$_3$ as the etchant gas. This etch is timed to stop about 100 Å into the layer 24. The photoresist layer 30 is then removed and a second photoresist layer 34 is deposited on the surface of the material structure and patterned to define a second recess (approximately 0.5 μm in width), generally indicated as element 36 in FIG. 4. The etching for the second recess stops on InGaAs etch stop layer 22, as BCl$_3$ does not appreciably etch InGaAs. It may be appreciated that an AlGaAs etch stop layer may be used instead of the InGaAs layer. However, the gas used to etch the layers above the etch stop layer will likely be different (i.e. BCl$_3$+SF$_6$ instead of BCl$_3$). The use of this dry etching process produces near vertical recess sidewalls. First gate contact metal, typically Ti/Pt/Au, having thickness of approximately 500 Å/500 Å/1000 Å, respectively is evaporated to define gate 38. Excess metallization 40 is left on the photoresist 34 after the gate metal deposition, but is lifted off with the removal of photoresist 34. FIG. 5 shows a third layer of photoresist 42 deposited and patterned as described above to define the location of a first recess (approximately 3 μm in width) for a heterostructure FET (HFET). Again, a technique such as Reactive Ion Etching using BCl$_3$+SF$_6$, in this example, is used in a timed manner to etch through the cap layer 28 and partially (300 Angstroms) into the AlGaAs layer 26. As with the PHEMT, the photoresist 42 is removed and a fourth photoresist layer is deposited and patterned for a second recess (approximately 0.5 μm in width), indicated in FIG. 6 by 44. This etch is timed to leave approximately 300 Angstroms of AlGaAs beneath the second recess. Second gate contact metal 46 is deposited as described above. Excess gate metallization 48 is lifted off with the removal of photoresist layer 43. This leaves the structure shown in FIG. 7. GaAs cap layer 28 is heavily doped to facilitate the formation of first and second ohmic source contacts (50, 52) and first and second drain contacts (54, 56), shown in FIG. 8. The source and drain contacts can be, for example, AuGe/Ni/Au deposited by evaporation and liftoff in thicknesses of approximately 1500 Å/420 Å/2000 Å, respectively. The contacts are alloyed at approximately 450° C. for about 2 minutes, thereby driving the contact material through layers 28, 26, 24, 22, 20 and into layer 19.

It should be noted that the dimensions given in the embodiments described hereinabove are primarily for use in X-band operation and may be adjusted for higher frequency operation. For example, if higher frequency operation were desired, the wide and gate recess dimensions would be decreased, the thickness of the AlGaAs under the gate of the HFET would be decreased, the channel thickness of the HFET would be decreased, and the doping levels would be increased. Additionally, the InGaAs channel layer would be thinner and have a higher doping pulse concentration. Millimeter-wave operation can be achieved by making changes such as those cited above.

Further, it may be appreciated that though the preferred embodiments described hereinabove included an etch stop layer 22, an etch technique may be employed that relies on timing to stop the second recess etch for the PHEMT device. This obviates the need for an etch stop layer like layer 22. The functioning of the devices is not altered appreciably by the omission of this layer.

Additionally, though there is advantage to the use of recesses in locating the gate structure of the devices, it may be appreciated that similar performance may result by simply adjusting the gate and drain biases. For example, the HFET may be operated at a relatively high drain voltage (about 9 volts) and higher drain current ($\geq 0.5$ Idss). The PHEMT may be operated at a relatively low drain voltage (about 2–3 volts) and very close to pinch off, as drain current is a major contributor to amplifier noise.

Figure 9:
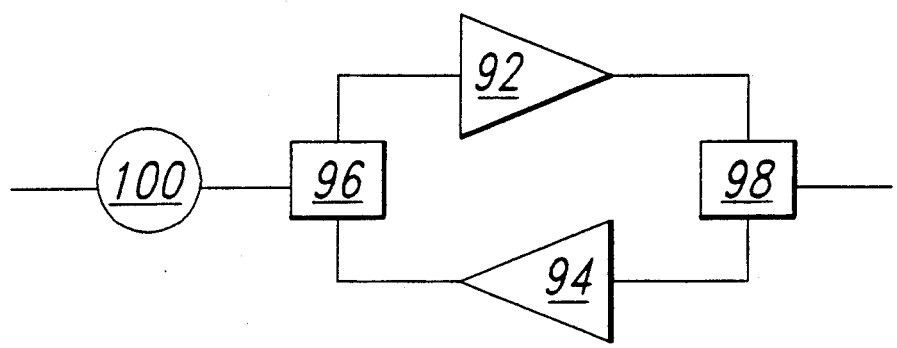
FIG. 9 is a system block diagram of the functions that can be integrated onto a single substrate using low-noise and power devices.

A third preferred embodiment of the inventive concept, a transmitter and receiver integrated circuit, is shown in FIG. 9. Traditionally, the power amplifier 92, low-noise amplifier 94, transmit/receive switches 96, 98, and phase shifter 100 have been fabricated as separate integrated circuits. This might be due to the fact that the specialized performance requirements of each circuit have demanded that different types of transistors be used. Indeed, the design of monolithic amplifiers of a single FET type is well known. However, the present inventive concept allows the integration of these specialized functions that demand different device types onto a single substrate, thereby reducing parts count and handling risks. It also eliminates the need for inter-chip wiring, a major source of reliability and yield problems in high-frequency systems.

Power amplifier 92 is typically designed to incorporate a power transistor such as the HFET 82 because of its high breakdown voltage. A typical amplifier might have several 0.5 μm-long gate "fingers" to increase the total area available in the transistor for amplification. In addition, the amplifier might include matching and bias networks made of selectively deposited metal inductive transmission line lengths and parallel-plate capacitors formed on the substrate. Such circuits are known in the art. Resistors can also be formed on the substrate by depositing a layer of TaN, for example, in a thickness and area to give a desired resistance. Additionally, resistors may be formed of one of the layers of the epitaxial material structure, or even by ion implanting dopants into a region of the semi-insulating substrate.

Low-noise amplifier 94 is typically designed to incorporate a low-noise device such as the PHEMT 80 because of its excellent noise performance characteristics. Again a typical amplifier might have several gate fingers to provide gain or power. The matching and bias networks described above for the power amplifier might be used for the low-noise amplifier as well.

In addition, transmit/receive switches 96 and 98 could easily be monolithically integrated with the amplifiers. Typically, the switch 96 in the receive path is required to be low-loss, and is not required to handle a great deal of power. Consequently, a switch designed around the low-noise PHEMT 80 could be appropriate. Conversely, switch 98 is in the high-power transmit path and would benefit from the use of the high breakdown voltage HFET 82. Even the phase shift functions so often required in phased array radar applications could be integrated onto the same substrate. Phase shifters are typically designed as switched line lengths to provide discrete phase increments, and are required to be low-loss as well. Again the use of low-noise PHEMT 80 switches is appropriate.

A few preferred embodiments have been described in detail hereinabove. It is to be understood that the scope of the invention also comprehends embodiments different from those described, yet within the scope of the claims. For example, the preferred embodiments describe structures fabricated using GaAs layers and an AlGaAs layer. It should be noted that virtually any substantially lattice matched heterojunction material system could be used in this invention. For example, InP/GaInAsP, CdTe/HgCdTe, InGaAs/AlGaAs, or GaAs/GaInP could be used.

Internal and external connections can be ohmic, capacitive, inductive direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit for providing low-noise and high-power microwave operation comprising:
   a) forming a donor layer above a substrate;
   b) forming a first wide bandgap buffer layer above said planar donor layer;
   c) forming an undoped first channel layer above said first wide bandgap layer;
   d) forming a second channel layer above said first channel layer;
   e) forming a second wide bandgap layer above said second channel layer;
   f) forming a cap layer above said second wide bandgap layer;
   g) forming a first transistor configuration by forming a first recess that extends through said cap layer, said second wide bandgap layer, and into said second channel layer in a first pattern;
   h) forming a second transistor configuration by forming a second recess that extends through said cap layer and slightly into said second wide bandgap layer;
   i) forming a third recess inside of said first recess that extends through said second channel layer;
   j) forming a fourth recess inside of said second recess that extends further into said second wide bandgap layer than said second recess;
   k) forming a first gate contact in said third recess;
   l) forming a second gate contact in said fourth recess;
   m) forming a first drain contact on said cap layer on one side of said first recess and a first source contact on an opposite side of said first recess; and
   n) forming a second drain contact on said cap layer on one side of said second recess and a second source contact on an opposite side of said second recess, wherein said contacts are alloyed and driven through said cap layer, said second wide bandgap layer, said second channel layer and said first wide bandgap layer to make contact with first channel layer and said second channel layer.

2. The method of claim 1 wherein said substrate, said second channel layer, and said cap layer are GaAs.

3. The method of claim 1 wherein said first channel layer is InGaAs.

4. The method of claim 1 wherein said second channel layer is GaAs.

5. The method of claim 1 wherein said first and second wide bandgap layers are AlGaAs.

6. The method of claim 1 further comprising the step of selectively forming metallization on one of said layers or on said substrate to form an amplifier incorporating said first transistor and an amplifier incorporating said second transistor.

7. The method of claim 1 further comprising selectively forming metallization on one of said layers or on said substrate to form a switch incorporating said first transistor.

8. The method of claim 1 further comprising selectively forming metallization on one of said layers or on said substrate to form a switch incorporating said second transistor.

9. The method of claim 1 further comprising selectively forming metallization on one of said layers or on said substrate to form a phase shifter incorporating said first transistor.

* * * * *